(12) United States Patent
Matsubara et al.

(10) Patent No.: US 8,351,878 B2
(45) Date of Patent: Jan. 8, 2013

(54) RADIO APPARATUS, DISTORTION CORRECTION DEVICE, AND DISTORTION CORRECTION METHOD

(75) Inventors: Satoshi Matsubara, Kawasaki (JP); Shuya Hirata, Kawasaki (JP); Takeshi Ohba, Kawasaki (JP); Hideharu Shako, Kawasaki (JP); Jun Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 108 days.

(21) Appl. No.: 13/026,614

(22) Filed: Feb. 14, 2011

(65) Prior Publication Data

US 2011/0221524 A1   Sep. 15, 2011

(30) Foreign Application Priority Data

Mar. 12, 2010   (JP) ................. 2010-056585

(51) Int. Cl.
 *H04B 1/04* (2006.01)
 *H04B 7/00* (2006.01)
(52) U.S. Cl. ........... 455/114.3; 455/63.1; 455/501
(58) Field of Classification Search .......... 455/63.1, 455/67.13, 114.3, 115.1, 501
See application file for complete search history.

(56) References Cited

U.S. PATENT DOCUMENTS

| | | | |
|---|---|---|---|
| 6,552,609 B2 * | 4/2003 | Hamada et al. | 330/149 |
| 7,106,133 B2 * | 9/2006 | Hamada et al. | 330/149 |
| 7,190,932 B2 * | 3/2007 | Irscheid et al. | 455/78 |
| 7,342,976 B2 * | 3/2008 | McCallister | 375/269 |
| 7,405,680 B2 * | 7/2008 | Funyu et al. | 341/118 |
| 7,742,778 B2 * | 6/2010 | Husted et al. | 455/501 |
| 2001/0007435 A1 | 7/2001 | Ode et al. | |
| 2003/0067995 A1 | 4/2003 | Matsuoka et al. | |
| 2005/0047521 A1 | 3/2005 | Ishikawa et al. | |
| 2008/0197925 A1 | 8/2008 | Furuta et al. | |
| 2009/0054016 A1 | 2/2009 | Waheed et al. | |

FOREIGN PATENT DOCUMENTS

| | | |
|---|---|---|
| EP | 2 202 879 | 6/2010 |
| JP | 2008-219674 | 9/2008 |
| JP | 2008-295089 | 12/2008 |
| WO | 03/103163 | 12/2003 |

OTHER PUBLICATIONS

European Search Report dated Nov. 22, 2011, from corresponding European Application No. 11 15 6073.

* cited by examiner

*Primary Examiner* — Sonny Trinh

(74) *Attorney, Agent, or Firm* — Katten Muchin Rosenman LLP

(57) ABSTRACT

When a distortion correction coefficient, which is calculated according to a signal input to a power amplifier and a signal output from the power amplifier, is larger than a first threshold, a distortion correction coefficient corresponding to the input signal is updated to the first threshold. When the calculated distortion correction coefficient is equal to or smaller than the first threshold, the distortion correction coefficient corresponding to the input signal is updated to the calculated distortion correction coefficient.

4 Claims, 10 Drawing Sheets

RADIO APPARATUS, DISTORTION CORRECTION DEVICE, AND DISTORTION CORRECTION METHOD

CROSS-REFERENCE TO RELATED APPLICATION

This application is based upon and claims the benefit of priority of the prior Japanese Patent Application No. 2010-056585, filed on Mar. 12, 2010, the entire contents of which are incorporated herein by reference.

FIELD

The embodiments discussed herein are directed to a radio apparatus, a distortion correction device, and a distortion correction method.

BACKGROUND

In recent years, high-efficiency transmission using digitization has been employed in radio communications. Usually, a radio apparatus that performs such radio communications includes a power amplifier. The radio apparatus inputs a transmission signal to the power amplifier and then emits the transmission signal, whose power is amplified and which is output from the power amplifier, to the atmosphere via an antenna. Hereinafter, the power of the signal that is input to the power amplifier can be referred to as an "input power" and the power of the signal that is output from the power amplifier can be referred to as an "output power".

Such a power amplifier has a characteristic that, when the input power is larger than a certain value, the relation between the input power and the output power is not liner. This characteristic will be described here using FIG. 9. FIG. 9 is a graph of an example of I/O (input/output) characteristics of the power amplifier. The horizontal axis in FIG. 9 represents the power of the signal that is input to the power amplifier and the vertical axis in FIG. 9 represents the power of the signal that is output from the power amplifier.

In the example illustrated in FIG. 9, when the input power is smaller than a certain value "PX", the relation between the input power and the output power is linear. In contrast, when the input power is larger than the certain value "PX", the relation between the input power and the output power is not linear. Specifically, when the input power is larger than the certain value "PX", the output power is saturated. As described above, the I/O characteristics of the power amplifier can be divided into a "liner area" in which the relation between the input power and the output power is linear and a "non-linear area" in which the relation between the input power and the output power is not linear.

The signal that is output from the power amplifier having the above-described non-linear area contains a non-linear distortion, which leads to a problem that the communication quality deteriorates. This problem will be described here using FIG. 10. FIG. 10 is a graph of an example of frequency spectrums. The horizontal axis in FIG. 10 represents the frequency and the vertical axis in FIG. 10 represents the power. The solid line L11 in FIG. 10 represents the frequency spectrum of the signal on which power amplification is performed in the non-linear area and the dotted line L12 in FIG. 10 represents the frequency spectrum of the signal on which power amplification is performed in the linear area.

As illustrated in FIG. 10, sidelobe increases in the power of the signal on which power amplification is performed in the non-linear area compared with the power of the signal on which power amplification is performed in the liner area, and thus a power leakage to adjacent channels occurs. This is because a signal on which power amplification is performed in a non-linear area contains more non-linear distortions compared with a signal on which power amplification is performed on a liner area. Such power leakage deteriorates the communication quality of adjacent channels.

Some recent radio apparatuses include a distortion corrector that corrects a non-linear distortion contained in a transmission signal in order to prevent deterioration of the communication quality. Specifically, the distortion corrector performs a distortion correction process on an input signal, which is input to a power amplifier, using a distortion correction coefficient that is stored in a predetermined storage unit. The distortion corrector calculates an update value of the distortion correction coefficient according to the input signal, which is input to the power amplifier, and a feedback signal that is fed back from the power amplifier. The distortion corrector then updates the distortion correction coefficient, which is stored in the predetermined storage unit, to an update value of the distortion correction coefficient.

Patent Document 1: Japanese Laid-open Patent Publication No. 2008-219674

Patent Document 2: International Publication Pamphlet No. WO 2003/103163

However, using a conventional technology in which the above-described distortion correction process is performed leads to a problem that the power range of the transmission signal ensuring the communication quality narrows. This problem will be described here using FIG. 11.

FIG. 11 is a graph of the relation between the gain of the power amplifier and the expected value of the distortion correction coefficient. The horizontal axis in FIG. 11 represents the power of the signal that is input to the power amplifier and the vertical axis in FIG. 11 represents the gain of the power amplifier or the expected value of the distortion correction coefficient. The phrase "expected value of the distortion correction coefficient" means an optimum value of the distortion correction coefficient that is used for the distortion correction process or the average value of optimum values of the distortion correction coefficient. The solid line L13 in FIG. 11 represents the gain of the power amplifier and the dotted line L14 in FIG. 11 represents the expected value of the distortion correction coefficient. The numerical values above the dotted line L14 denote an example of distortion correction coefficients.

As illustrated in the example in FIG. 11, if the input power is larger than a certain value, the output power is saturated and thus the gain of the power amplifier decreases. Thus, as represented by the dotted line L14 in FIG. 11, it is desirable that, when the input power is larger than the certain value, the distortion corrector perform the distortion correction process using a larger distortion correction coefficient as the input power increases. However, because the distortion corrector stores distortion correction coefficients respectively for the ranges of the input power, the distortion correction process may possibly not be performed using an optimum distortion correction coefficient on each input power not as in the case represented by the dotted line L14 in FIG. 11. This aspect will be described below.

In the example illustrated in FIG. 11, the distortion corrector stores "1.0" as the distortion correction coefficient corresponding to the input power "P10" to "P20". Similarly, the distortion corrector stores "1.0" as the distortion correction coefficients corresponding to the input powers "P20" to "P30", "P30" to "P40", "P40" to "P50", "P50" to "P60", and "P60" to "P70". The distortion corrector also stores any value of "1.0" to "1.5" as the distortion correction coefficient corresponding to the input power "P70" to "P80". The distortion corrector also stores any value of "1.5" to "4.0" as the distortion correction coefficient corresponding to the input power "P80" to "P90". Hereinafter, "Pxx" to "Pyy" means equal to or larger than "Pxx" and smaller than "Pyy".

It is assumed that the expected value of the distortion correction coefficient with respect to the signal having the input power "P81" is "1.7" and the expected value of the distortion correction coefficient with respect to the signal having the input power "P82" is "3.8". In addition, it is assumed that the signal having the input power "P81" is input to the power amplifier and accordingly the distortion corrector gradually updates the distortion correction coefficient corresponding to the input power "P80" to "P90" to "1.7". When a signal having the input power "P82" is then input to the power amplifier, the distortion corrector performs the distortion correction process using the distortion correction coefficient "1.7" until the distortion correction coefficient is updated. However, it is desirable that the distortion correction process be performed on the signal having the input power "P82" using the distortion correction coefficient "3.8". For this reason, the above-described distortion correction process may not sufficiently correct the non-liner distortion contained in the signal.

It is assumed that, in the above example, the signal having the input power "P82" is input to the power amplifier and accordingly the distortion corrector gradually updates the distortion correction coefficient corresponding to the input power "P80" to "P90" to "3.8". Thereafter, when a signal having the input power "P81" is input, the distortion corrector performs the distortion correction process using the distortion correction coefficient "3.8". However, it is desirable that the distortion correction process be performed on the signal having the input power "P81" using the distortion correction coefficient "1.7". For this reason, the above-described distortion correction process may not sufficiently correct the non-liner distortion contained in the transmission signal.

The same may possibly occur regarding the input power "P70" to "P80". For example, the distortion corrector may possibly perform a distortion correction using a distortion correction coefficient "1.1" on a signal regarding which it is preferable that a distortion correction is performed using a distortion correction coefficient "1.4". However, because the difference between the distortion correction coefficient "1.4" and the distortion correction coefficient "1.1" is small, the distortion corrector may possibly correct the non-liner distortion contained in the signal. In other words, the distortion corrector may possibly not sufficiently correct the non-linear distortion contained in the transmission signal if the range of the distortion correction coefficient is broad as in the case of the input power "P80" to "P90".

For this reason, in the example illustrated in FIG. 11, when the power of the signal that is input to the power amplifier is equal to or larger than "P80", the non-linear distortion may possibly not corrected in the signal that is output from the power amplifier. If the power of the signal that is input to the power amplifier is equal to or larger than "P80", the radio apparatus including the power amplifier that has the characteristics illustrated in FIG. 11 may not ensure the communication quality. In other words, in order to transmit a signal ensuring the communication quality, the radio apparatus limits the power of the signal that is input to the power amplifier to be smaller than "P80". For this reason, in the conventional technology in which the distortion correction process is performed, the power range of the transmission signal to ensure the communication quality narrows and thus the performance of the power amplifier may not be sufficiently brought out.

A technology has been recently proposed in which no distortion correction coefficient is generated and updated when the instantaneous power of a transmission signal exceeds a threshold. However, it is still difficult to solve the above-described problem using this technology. Specifically, this technology does not update the distortion correction coefficient, therefore, there is a risk that a non-linear distortion contained in the transmission signal is not corrected in the distortion correction process.

SUMMARY

According to an aspect of an embodiment of the invention, a radio apparatus includes a power amplifier that amplifies a power of an input signal, a storage unit that stores distortion correction coefficients for correcting distortion occurring in the power amplifier, the distortion correction coefficients being stored respectively for predetermined power ranges of the input signal, a distortion corrector that acquires a distortion correction coefficient corresponding to the power of the input signal from the storage unit and performs a distortion correction process on the input signal using the acquired distortion correction coefficient, an arithmetic operator that calculates a distortion correction coefficient according to the input signal and an output signal output from the power amplifier, a comparator that compares a first threshold with the distortion correction coefficient obtained by the arithmetic operator, the first threshold being the maximum distortion correction coefficient that ensures predetermined quality with respect to an input signal having the minimum power in a power range regarding which the maximum difference between expected values of a distortion correction coefficient corresponding to a signal within the power range is equal to or larger than a predetermined value, and an update unit that updates the distortion correction coefficient stored in the storage unit and corresponding to the input signal to the first threshold, when the distortion correction coefficient obtained by the arithmetic operator is larger than the first threshold as a result of the comparing by the comparator.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. The embodiments do not limit the radio apparatus, the distortion correction device, and the distortion correction method that are disclosed by this application.

[a] First Embodiment

Figure 1:
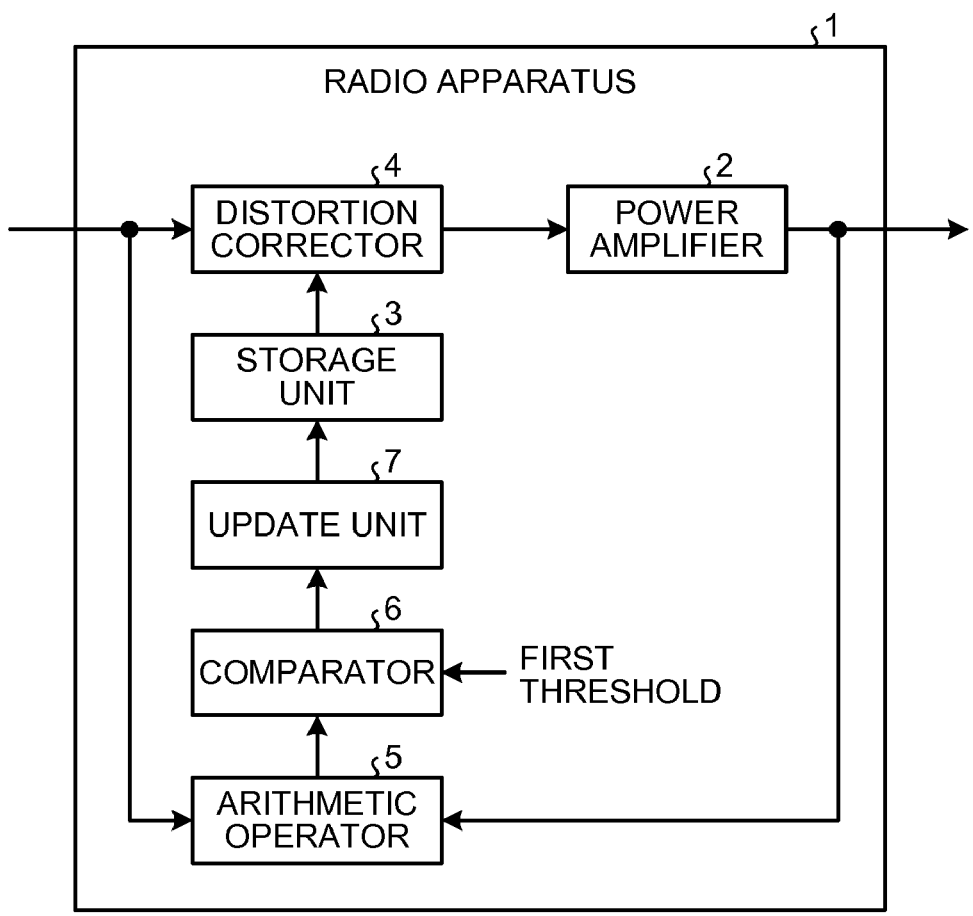
FIG. 1 is a block diagram of a configuration example of a radio apparatus according to a first embodiment.

First, a radio apparatus according to a first embodiment of the present invention will be described using FIG. 1. FIG. 1 is a block diagram of a configuration example of a radio apparatus according to the first embodiment. As illustrated in FIG. 1, a radio apparatus 1 according to the first embodiment includes a power amplifier 2, a storage unit 3, a distortion corrector 4, an arithmetic operator 5, a comparator 6, and an update unit 7.

The power amplifier 2 amplifies the power of a signal that is input to the power amplifier 2. Specifically, the power amplifier 2 amplifies the power of a signal that is input from the distortion corrector 4, which will be described below. The signal whose power is amplified by the power amplifier 2 is fed back to the arithmetic operator 5, which will be described below. The storage unit 3 stores distortion correction coefficients, for correcting distortions that occur in the power amplifier 2, respectively for predetermined power ranges of an input signal that is input to the power amplifier 2.

The distortion corrector 4 acquires, from the storage unit 3, a distortion correction coefficient corresponding to the power of the input signal, which is input to the power amplifier 2, and performs a distortion correction process on the input signal using the acquired distortion correction coefficient. The distortion corrector 4 previously provides the input signal with a distortion corresponding to a distortion that occurs in the power amplifier 2. Accordingly, the distortion previously provided to the input signal and the distortion that occurs in the power amplifier 2 are canceled.

The arithmetic operator 5 calculates a distortion correction coefficient according to the input signal, which is input to the power amplifier 2, and the output signal, which is output from the power amplifier 2. The comparator 6 compares the distortion correction coefficient, which is obtained by the arithmetic operator 5, with a predetermined first threshold.

An optimum upper-limit value of the optimum distortion correction coefficient in proximity to the saturated power of the power amplifier 2 is set as the first threshold. The phrase "in proximity to the saturated power" means the power range regarding which the maximum difference between expected values of the distortion correction coefficient is the minimum (hereinafter "saturation proximity power range") out of power ranges, stored in the storage unit 3, regarding each of which the maximum difference between expected values of the distortion correction coefficient for each input signal within the power ranges is equal to or larger than a predetermined value. The maximum distortion correction coefficient that can ensure the predetermined quality with respect to the input signal having the minimum power within the saturation proximity power range is set as the first threshold. The example of setting the first threshold will be described below.

When the distortion correction coefficient that is obtained by the arithmetic operator 5 is larger than the first threshold as a result of the comparison by the comparator 6, the update unit 7 updates the distortion correction coefficient, which corresponds to the input signal that is input to the power amplifier 2 and is stored in the storage unit 3, to the first threshold. When the distortion correction coefficient that is obtained by the arithmetic operator 5 is equal to or smaller than the first threshold, the update unit 7 updates the distortion correction coefficient in the storage unit 3 to the distortion correction coefficient obtained by the arithmetic operator 5.

As described above, when the distortion correction coefficient that is calculated according to the input signal to the power amplifier 2 and the output signal from the power amplifier 2 is larger than the first threshold, the radio apparatus 1 updates the distortion correction coefficient in the storage unit 3 to the first threshold. In other words, when the distortion correction coefficient as a result of the arithmetic operation is larger than the first threshold that is the upper-limit value of the distortion correction coefficient, the radio apparatus 1 limits the distortion correction coefficient to the first threshold by clipping.

Figure 2:
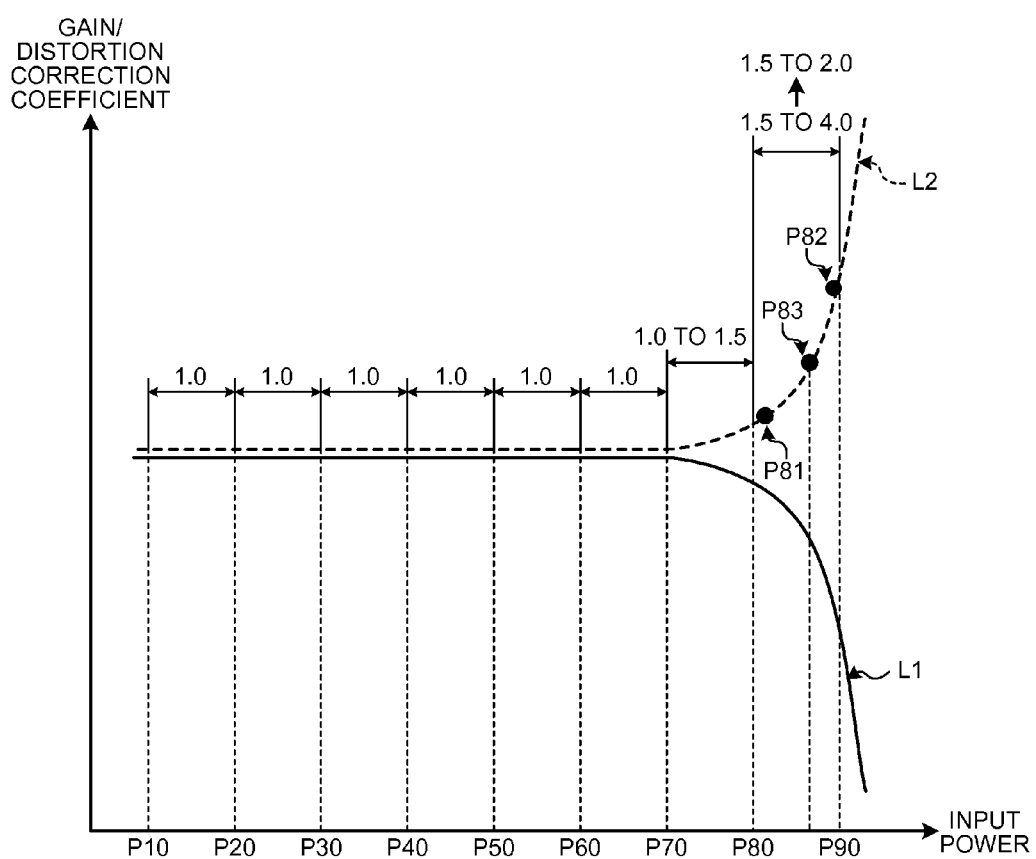
FIG. 2 is a graph of an example of the relation between the gain of a power amplifier and an expected value of a distortion correction coefficient in the first embodiment.

An example of a distortion correction coefficient update process performed by the radio apparatus 1 will be described here using FIG. 2. FIG. 2 is a graph of an example of the relation between the gain of the power amplifier 2 and an expected value of the distortion correction coefficient. The horizontal axis in FIG. 2 represents the power of a signal that is input to the power amplifier 2 and the vertical axis in FIG. 2 represents the gain of the power amplifier 2 or the expected value of the distortion correction coefficient. The solid line L1 in FIG. 2 represents the gain of the power amplifier 2 and the dotted line L2 in FIG. 2 represents the expected value of the distortion correction coefficient. The numerical values above the dotted line L2 represent an example of distortion correction coefficients.

In the following description, it is assumed that the storage unit 3 stores distortion correction coefficients respectively for power ranges of input powers "P10" to "P20", "P20" to "P30", . . . , "P70" to "P80", and "P80" to "P90". In the example illustrated in FIG. 2, it is assumed that the expected value of the distortion correction coefficient corresponding to the input power "P80" is "1.5" and the expected value of the distortion correction coefficient corresponding to the input power "P90" is "4.0". In addition, it is assumed that the expected value of the distortion correction coefficient corresponding to the input power "P82" is "3.8" and the expected value of the distortion correction coefficient corresponding to the input power "P83" is "2.0".

It is desirable that the distortion correction process be performed on the signal having the input power "P80" using the distortion correction coefficient "1.5". When "1.5" is stored as the distortion correction coefficient corresponding to the power range "P80" to "P90" in the storage unit 3, the distortion correction process sufficiently corrects a non-linear distortion on the signal having the input power "P80" using the distortion correction coefficient "1.5". In contrast, when "4.0" is stored as the distortion correction coefficient corresponding to the power range "P80" to "P90" in the storage unit 3, the distortion correction process may not sufficiently correct a non-linear distortion on the signal having the input power "P80" using the distortion correction coefficient "4.0". However, even if the distortion correction process is performed on the signal having the input power "P80" using a distortion correction coefficient that is slightly different from "1.5", the non-linear distortion is sufficiently corrected and thus the predetermined communication quality can be ensured.

For this reason, the maximum distortion correction coefficient that can ensure the predetermined quality with respect to the input signal having the minimum power within the saturation proximity power range is set as the above-described first threshold. An example of setting the first threshold will be described below.

In the example illustrated in FIG. 2, the expected values of the distortion correction coefficients with respect to respective input signals within the power range "P10" to "P20" are all "1.0", therefore, the maximum difference between expected values of the distortion correction coefficient within the power range "P10" to "P20" is "0". Similarly, the maximum difference between expected values of the distortion correction coefficient in each of the power ranges "P20" to "P30", "P30" to "P40", "P40" to "P50", "P50" to "P60", and "P60" to "P70" is "0". In contrast, the expected values of the distortion correction coefficient in the power range "P70" to "P80" are "1.0" to "1.5", therefore, the maximum difference between the expected values of the distortion correction coefficient is "0.5". In addition, the expected values of the distortion correction coefficient in the power range "P80" to "P90" are "1.5" to "4.0", therefore, the maximum difference between the expected values of the distortion correction coefficient is "2.5". It is assumed that the maximum difference between expected values of the distortion correction coefficient in the power range "P90" to "P100" is "5.0", although it is not illustrated in FIG. 2.

The maximum differences each between expected values of the distortion correction coefficient in the respective power ranges are as follows.
POWER RANGE "P10" to "P20":0
POWER RANGE "P20" to "P30":0
POWER RANGE "P30" to "P40":0
POWER RANGE "P40" to "P50":0
POWER RANGE "P50" to "P60":0
POWER RANGE "P60" to "P70":0
POWER RANGE "P70" to "P80":0.5
POWER RANGE "P80" to "P90":2.5
POWER RANGE "P90" to "P100":5.0

In other words, among the power ranges regarding which the maximum difference between expected values of the distortion correction coefficient is equal to or larger than the predetermined value, the power range regarding which the maximum difference is the minimum serves as "the saturation proximity power range". It is assumed that "the predetermined value" is "2.0". Thus, in the above example, the power range regarding which the maximum difference between expected values of the distortion correction coefficient is equal to or larger then the predetermined value "2.0" corresponds to the power range "P80" to "P90" and the power range "P90" to "P100". Among these power ranges, the power range regarding which the maximum difference between expected values of the distortion correction coefficient is the minimum serves as the "saturation proximity power range". The maximum difference between expected values of the distortion correction coefficient regarding the power range "P80" to "P90" is smaller than that regarding the power range "P90" to "P100". Accordingly, the power range "P80" to "P90" servers as the "saturation proximity power range".

The maximum distortion correction coefficient that can ensure the predetermined quality with respect to the signal having the minimum power "P80" within the saturation proximity power range "P80" to "P90" is set as the first threshold. For example, it is assumed that, when a distortion correction is performed on the input power "P80" using any value of the distortion correction coefficient "1.0" to "2.0", the predetermined quality can be ensured. In this case, the maximum value "2.0" of the distortion correction coefficient "1.0" to "2.0" is set as the first threshold.

When "2.0" is set as the first threshold as described above, even if the radio apparatus 1 calculates the distortion correction coefficient "4.0" corresponding to the input power "P90", the radio apparatus 1 updates the distortion correction coefficient corresponding to the power range "P80" to "P90" to the first threshold "2.0". Accordingly, even when the signal having the input power "P80" is then input to the power amplifier 2, the radio apparatus 1 performs the distortion correction process on the signal using the distortion correction coefficient "2.0". Accordingly, even when the power of a signal that is input to the power amplifier 2 is "P80", the radio apparatus 1 can transmit a signal ensuring the predetermined quality.

In the example illustrated in FIG. 2, because the expected value of the distortion correction coefficient with respect to the signal having the input power "P83" is "2.0", even when the power of a signal that is input to the power amplifier 2 is "P83", the radio apparatus 1 can transmit a signal ensuring the predetermined quality. In other words, in the example illustrated in FIG. 2, when the power of a signal that is input to the power amplifier 2 is at least equal to or smaller than "P83", the radio apparatus 1 can transmit a signal ensuring the predetermined quality.

As described above, when a distortion correction coefficient as a result of an arithmetic operation is larger than the first threshold, the radio apparatus 1 according to the first embodiment updates the distortion correction coefficient to the first threshold. This broadens the power range of the transmission signal ensuring the communication quality.

[b] Second Embodiment

In a second embodiment of the present invention, an example of a radio apparatus that uses a different upper-limit threshold depending on the input power will be described next. The radio apparatus according to the second embodiment performs the distortion correction coefficient update process using a first threshold when the input power is equal to or larger than a predetermined value and performs the distortion correction coefficient update process using a second threshold when the input power is smaller than the predetermined value. The radio apparatus according to the second embodiment will be described in detail below.

Figure 3:
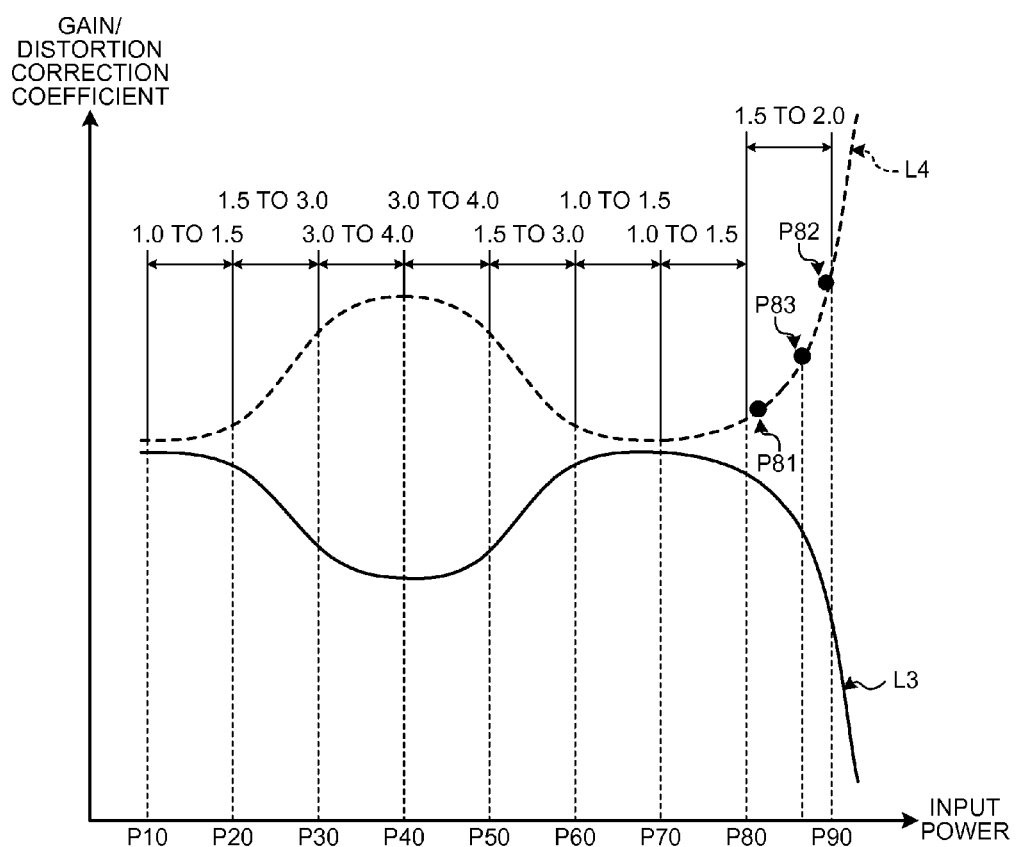
FIG. 3 is a graph of an example of the relation between the gain of a power amplifier and an expected value of a distortion correction coefficient in a second embodiment.

Distortion Correction Coefficient Update Process Performed by Radio Apparatus According to Second Embodiment An example of the distortion correction coefficient update process performed by a radio apparatus according to the second embodiment will be described below using FIG. 3. FIG. 3 is a graph of an example of the relation between the gain of a power amplifier and an expected value of a distortion correction coefficient in the second embodiment. The solid line L3 in FIG. 3 represents the gain of the power amplifier and the dotted line L4 in FIG. 3 represents the expected value of the distortion correction coefficient. The numerical values above the dotted line L4 represent an example of distortion correction coefficients.

As in the example illustrated in FIG. 3, the gain of the power amplifier of the radio apparatus according to the second embodiment decreases at an input power "P10" to "P40", increases at an input power "P40" to "P70", and decreases again at an input power equal to or larger than "P80". In other words, in the example illustrated in FIG. 3, not as in the case in FIG. 2, the expected value of the distortion correction coefficient varies at an input power "P10" to "P70".

In the example illustrated in FIG. 3, it is assumed that, when the distortion correction process is performed on a signal having an input power "P10" to "P20" using any value of the distortion correction coefficient "1.0" to "1.5", the non-linear distortion of the transmission signal is corrected such that the predetermined quality is ensured. Similarly, it is assumed that, when the distortion correction process is performed on signals of input powers "P20" to "P30", . . . , and "P60" to "P70" using any value of the distortion correction coefficient "1.5" to "3.0", . . . , and "1.0" to "1.5", the non-linear distortion of the transmission signal is corrected.

It is assumed that the saturation proximity power range is the power range "P80" to "P90" and the first threshold is "2.0". When the radio apparatus performs the distortion correction coefficient update process using only the first threshold "2.0", if the distortion correction coefficient "4.0" is calculated with respect to the input power "P40", the radio apparatus updates a distortion correction coefficient of the power range "P40" to "P50" to "2.0". This is because the distortion correction coefficient "4.0" is larger than the first threshold of "2.0". However, because the expected value of the distortion correction coefficient with respect to the input power "40" to "50" is "3.0" to "4.0", it is not preferable that the distortion correction coefficient is updated to "2.0".

For this reason, the radio apparatus according to the second embodiment performs the distortion correction coefficient update process using the first threshold when the input power is equal to or larger than the predetermined value (hereinafter "power threshold"). For example, the minimum power value within the saturation proximity power range or a power value that is the border between the linear area and the non-linear area of the power amplifier is set as the "power threshold". In the example illustrated in FIG. 3, it is assumed that the power threshold is the power "P70". In other words, in the example illustrated in FIG. 3, when the input power is equal to or larger than the power threshold of "P70", the radio apparatus according to the second embodiment performs the distortion correction coefficient update process using the first threshold.

When the input power is smaller than the power threshold "P70", the radio apparatus according to the second embodiment performs the distortion correction coefficient update process using the second threshold, which is different from the first threshold. For example, an upper-limit value of the distortion correction coefficient, which is determined in the system, may be set as the second threshold.

It is assumed that the second threshold is "4.0" and the radio apparatus according to the second embodiment calculates a distortion correction coefficient "4.2" corresponding to the input power "P40". In this case, because the input power of "P40" is smaller than the power threshold of "P70", the radio apparatus according to the second embodiment compares the distortion correction coefficient "4.2", which is the result of the arithmetic operation, with the second threshold "4.0". Because the distortion correction coefficient "4.2", which is the result of the arithmetic operation, is larger than the second threshold "4.0", the radio apparatus according to the second embodiment updates the distortion correction coefficient of the power range "P40" to "P50" to the second threshold "4.0".

As described above, the radio apparatus according to the second embodiment performs the distortion correction coefficient update process using a different threshold depending on the input power. Accordingly, even if the optimum upper-limit value of the distortion correction coefficient is different depending on the input power, the radio apparatus according to the second embodiment can update the distortion correction coefficient to a distortion correction coefficient ensuring the predetermined communication quality.

Configuration of Radio Apparatus According to Second Embodiment

Figure 4:
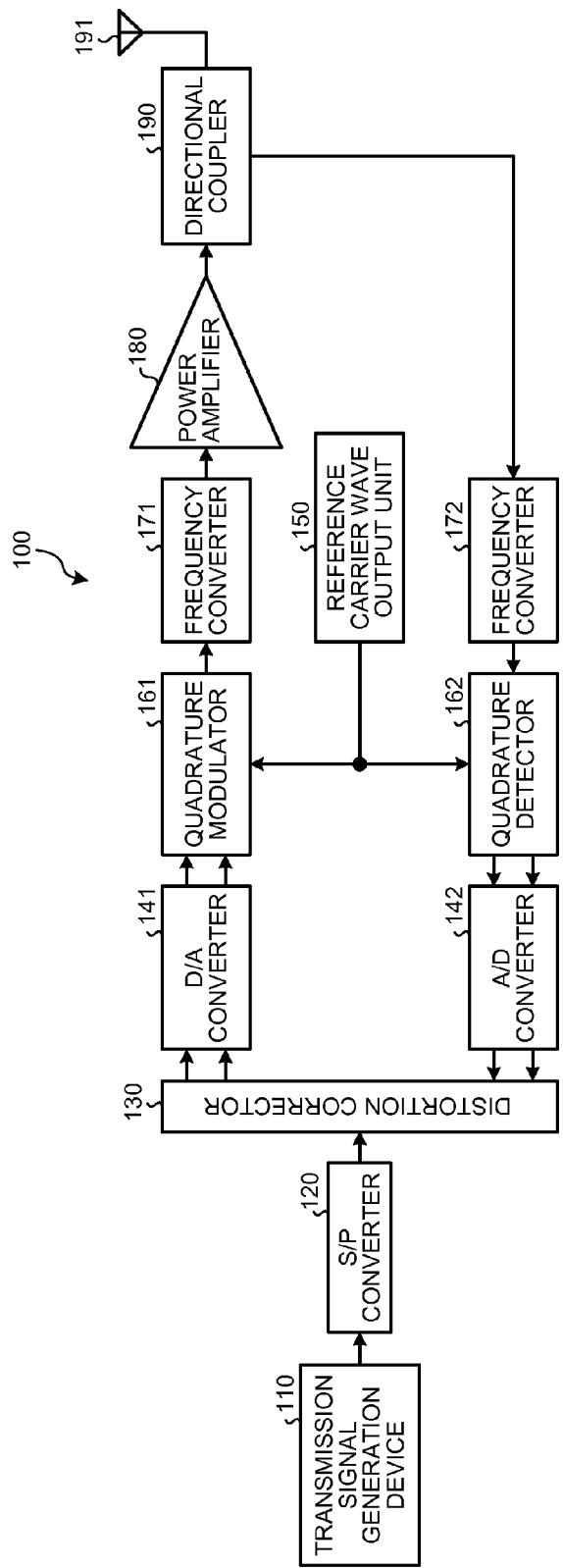
FIG. 4 is a block diagram of a configuration example of a radio apparatus according to the second embodiment.

A configuration of the radio apparatus according to the second embodiment will be described below using FIG. 4. FIG. 4 is a block diagram of a configuration example of the radio apparatus according to the second embodiment. A radio apparatus 100 in FIG. 4 is, for example, a radio base station or an RRH (remote radio head). As illustrated in FIG. 4, the radio apparatus 100 includes a transmission signal generation device 110, an S/P (serial/parallel) converter 120, a distortion corrector 130, a D/A (digital/analog) converter 141, a reference carrier wave output unit 150, a quadrature modulator 161, and a frequency converter 171.

The transmission signal generation device 110 generates a transmission signal and outputs the transmission signal to the S/P converter 120. Specifically, the transmission signal generation device 110 outputs a serial data stream to the S/P converter 120.

The S/P converter 120 sorts the serial digital data stream, which is input from the transmission signal generation device 110, alternately on a bit basis and converts the serial digital data stream into two sequences of data streams: an in-phase component signal (I signal) and a quadrature component signal (Q signal). The S/P converter 120 outputs the I signal and the Q signal to the distortion corrector 130. Any of the I signal and Q signal can be simply referred to as a "transmission signal" below.

The distortion corrector 130 performs a distortion correction process on the transmission signal that is input from the S/P converter 120. The distortion corrector 130 outputs the transmission signal, on which the distortion correction process is performed, to the D/A converter 141. The process performed by the distortion corrector 130 will be described below using FIGS. 5 and 6.

The D/A converter 141 converts the digital transmission signal, which is input from the distortion corrector 130, to an analog baseband signal. The D/A converter 141 outputs the transmission signal, on which the D/A conversion is performed, to the quadrature modulator 161.

The reference carrier wave output unit 150 outputs a signal whose frequency band is of a carrier wave to the quadrature modulator 161 and a quadrature detector 162, which will be described below. The quadrature modulator 161 multiplies the I signal, which is a transmission signal input from the D/A converter 141, by the reference carrier wave, which is input from the reference carrier wave output unit 150. The quadrature modulator 161 also multiplies the Q signal, which is a transmission signal input from the D/A converter 141, by a signal obtained by shifting the phase of the reference carrier wave by 90 degrees. The quadrature modulator 161 then performs a quadrature modulation by adding the result of the multiplication of the I signal and the result of the multiplication of the Q signal. The quadrature modulator 161 then outputs the transmission signal, on which the quadrature modulation is performed, to the frequency converter 171.

The frequency converter 171 performs a frequency conversion on the transmission signal, on which the quadrature modulation is performed and which is input from the quadrature modulator 161, by mixing the transmission signal and a locally-generated signal that is output from a local oscillator (not illustrated in the drawings). The frequency converter 171 then outputs the transmission signal, on which the frequency conversion is performed, to a power amplifier 180.

As illustrated in FIG. 4, the radio apparatus 100 includes the power amplifier 180, a directional coupler 190, an antenna 191, a frequency converter 172, the quadrature detector 162, and an A/D (analog/digital) converter 142.

The power amplifier 180 amplifies the power of the transmission signal that is input from the frequency converter 171 and outputs the transmission signal whose power is amplified to the directional coupler 190. The gain of the power amplifier 180 in the second embodiment has the characteristics illustrated in FIG. 3.

The directional coupler 190 is, for example, a coupler. The directional coupler 190 outputs the transmission signal, which is input from the power amplifier 180, to the antenna 191 and the frequency converter 172. The signal that is output from the directional coupler 190 to the frequency converter 172 can be referred to as a "feedback signal" below. The antenna 191 emits the transmission signal, which is input from the directional coupler 190, to the atmosphere.

The frequency converter 172 converts the frequency of the feedback signal, which is input from the directional coupler 190. The frequency converter 172 then outputs the feedback signal, on which the frequency conversion is performed, to the quadrature detector 162.

The quadrature detector 162 performs quadrature detection by multiplying the feedback signal, which is input from the frequency converter 172, by the reference carrier wave, which is input from the reference carrier wave output unit 150, and by multiplying the feedback signal by the reference carrier wave whose phase is shifted by 90 degrees. Accordingly, the quadrature detector 162 reproduces the I signal and the Q signal of the baseband. The quadrature detector 162 then outputs the I signal and the Q signal to the A/D converter 142.

The A/D converter 142 coverts the I signal and the Q signal, which are input from the quadrature detector 162, to digital signals and outputs the I signal and the Q signal, on which the A/D conversion is performed, to the distortion corrector 130. In this manner, the directional coupler 190, the frequency converter 172, the quadrature detector 162, and the A/D converter 142 feed back, to the distortion corrector 130, the signal that is output from the power amplifier 180.

Configuration of Distortion Corrector According to Second Embodiment

Figure 5:
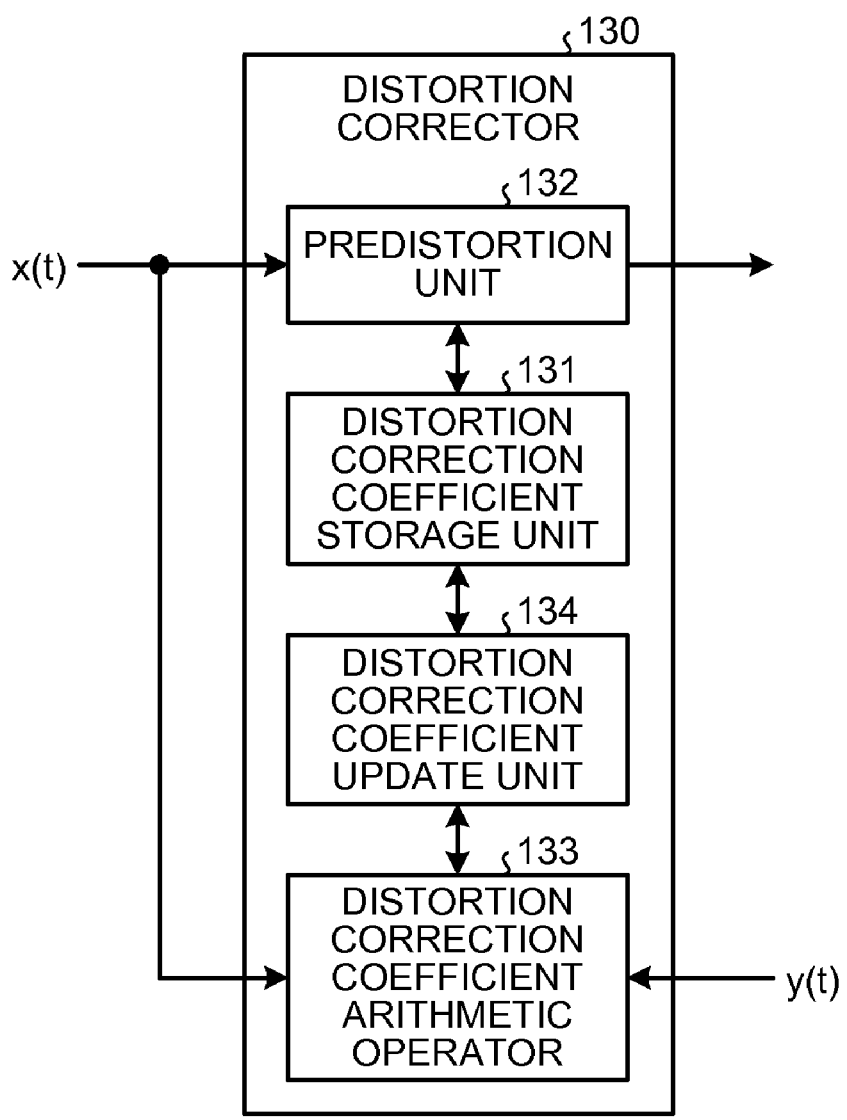
FIG. 5 is a block diagram of a configuration example of a distortion corrector according to the second embodiment.

A configuration of the distortion corrector 130 of the second embodiment will be described here using FIG. 5. FIG. 5 is a block diagram of a configuration example of the distortion corrector 130 of the second embodiment. As illustrated in FIG. 5, the distortion corrector 130 includes a distortion correction coefficient storage unit 131, a predistortion unit 132, a distortion correction coefficient arithmetic operator 133, and a distortion correction coefficient update unit 134.

The distortion correction coefficient storage unit 131 stores a distortion correction coefficient h(i) corresponding to a power pi of a transmission signal x(t) that is input from the S/P converter 120 to the distortion corrector 130. The value i of the power pi ranges, for example, from 0 to 1023. In this case, the distortion correction coefficient storage unit 131 stores a distortion correction coefficient h(0) to h(1023) corresponding to the a power p0 to p1023 of the transmission signal x(t).

The distortion correction coefficient storage unit 131 corresponds to, for example, the storage unit 3 in FIG. 1.

The predistortion unit 132 performs a distortion correction process (predistortion) on the transmission signal x(t). Specifically, the predistortion unit 132 acquires a distortion correction coefficient h(i) corresponding to the power pi of the transmission signal x(t) from the distortion correction coefficient storage unit 131 and performs the distortion correction process on the transmission signal x(t) using the acquired distortion correction coefficient h(i). The predistortion unit 132 corresponds to, for example, the distortion corrector 4 in FIG. 1.

The distortion correction coefficient arithmetic operator 133 calculates a distortion correction coefficient h(i) according to the transmission signal x(t) and a feedback signal y(t), which is input from the A/D converter 142. For example, the distortion correction coefficient arithmetic operator 133 performs an applicable signal process using an LMS (least mean square) algorithm. In the applicable signal process, the distortion correction coefficient arithmetic operator 133 compares the transmission signal x(t) with the feedback signal y(t) that is input from the A/D converter 142 and calculates a distortion correction coefficient h(i) with which the difference between the transmission signal x(t) and the feedback signal y(t) is 0. The distortion correction coefficient arithmetic operator 133 corresponds to, for example, the arithmetic operator 5 in FIG. 1.

When the power pi of the transmission signal x(t) is equal to or larger than the power threshold, the distortion correction coefficient update unit 134 compares the distortion correction coefficient h(i), which is obtained by the distortion correction coefficient arithmetic operator 133, with the first threshold. When the distortion correction coefficient h(i) is larger than the first threshold, the distortion correction coefficient update unit 134 updates the distortion correction coefficient corresponding to the power pi, which is stored in the distortion correction coefficient storage unit 131, to the first threshold. In contrast, when the distortion correction coefficient h(i) is equal to or smaller than the first threshold, the distortion correction coefficient update unit 134 updates the distortion correction coefficient corresponding to the power pi, which is stored in the distortion correction coefficient storage unit 131, to the distortion correction coefficient h(i) that is obtained by the distortion correction coefficient arithmetic operator 133.

When the power pi of the transmission signal x(t) is smaller than the power threshold, the distortion correction coefficient update unit 134 compares h(i), which is obtained by the distortion correction coefficient arithmetic operator 133, with the second threshold. When the distortion correction coefficient h(i) is larger than the second threshold, the distortion correction coefficient update unit 134 updates the distortion correction coefficient corresponding to the power pi, which is stored in the distortion correction coefficient storage unit 131, to the second threshold. In contrast, when the distortion correction coefficient h(i) is equal to or smaller than the second threshold, the distortion correction coefficient update unit 134 updates the distortion correction coefficient corresponding to the power pi, which is stored in the distortion correction coefficient storage unit 131, to the distortion correction coefficient h(i) that is obtained by the distortion correction coefficient arithmetic operator 133. The distortion correction coefficient update unit 134 corresponds to, for example, the comparator 6 and the update unit 7 in FIG. 1.

Figure 6:
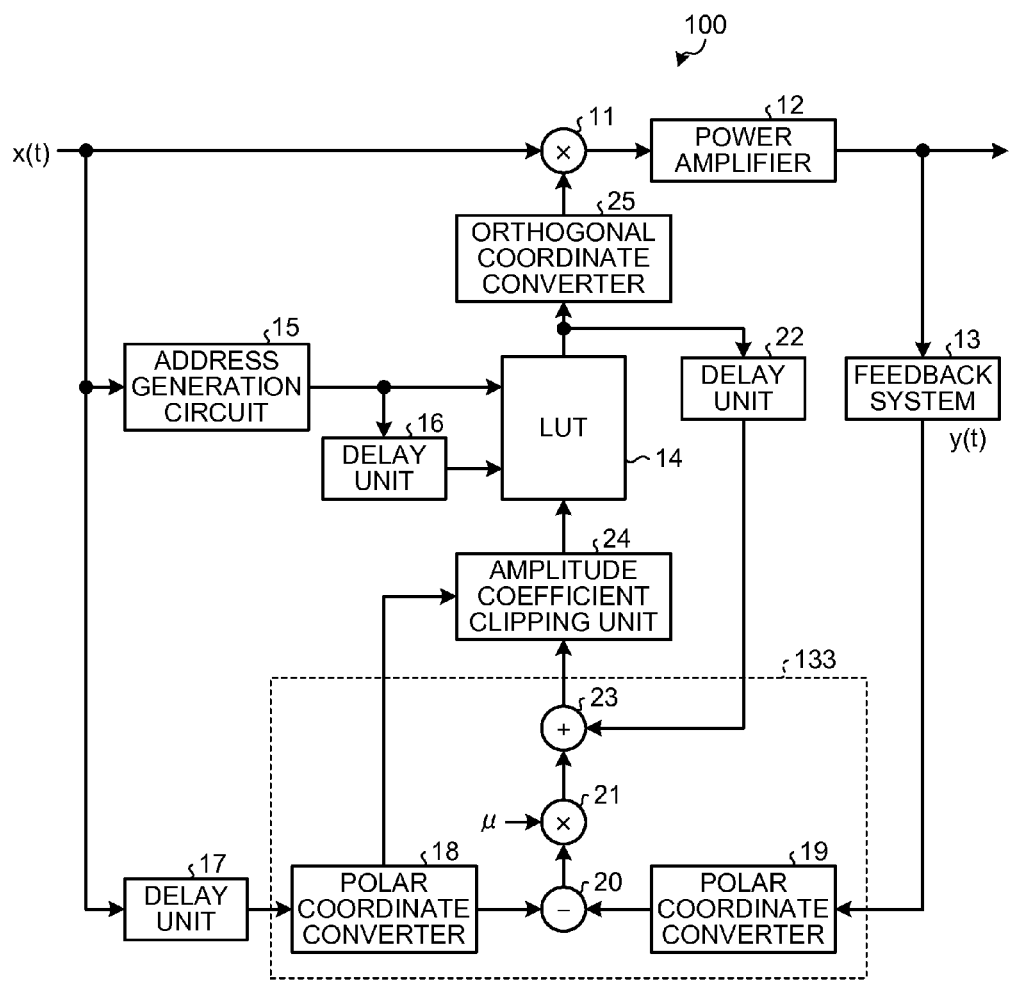
FIG. 6 is a block diagram of an example of a detailed configuration of the radio apparatus according to the second embodiment.

A configuration of the distortion corrector 130 in FIG. 5 will be described in more detail below here using FIG. 6. FIG. 6 is a block diagram of an example of a detailed configuration of the radio apparatus 100 according to the second embodiment. The transmission signal generation device 110, the S/P converter 120, the D/A converter 141, the quadrature modulator 161, the frequency converter 171, the antenna 191, and so forth among the units in FIG. 4 are omitted from FIG. 6.

As illustrated in FIG. 6, the radio apparatus 100 includes a multiplier 11, a power amplifier 12, a feedback system 13, an LUT (lookup table) 14, an address generation circuit 15, a delay unit 16, and a delay unit 17. The multiplier 11 corresponds to, for example, the predistortion unit 132 in FIG. 5. The power amplifier 12 corresponds to, for example, the power amplifier 180 in FIG. 4. The feedback system corresponds to, for example, the frequency converter 172, the quadrature detector 162, and the A/D converter 142 in FIG. 4. The LUT 14 corresponds to, for example, the distortion correction coefficient storage unit 131 in FIG. 5.

The multiplier 11 multiplies the transmission signal x(t), which is input from the S/P converter 120, by the distortion correction coefficient h(i) corresponding to the power pi of the transmission signal x(t). In this manner, the multiplier 11 performs the distortion correction process on the transmission signal x(t). The multiplier 11 acquires the distortion correction coefficient h(i) corresponding to the power pi of the transmission signal x(t) from the LUT 14, which will be described below.

The power amplifier 12 amplifies the power of the transmission signal, which is input from the multiplier 11. The transmission signal whose power is amplified by the power amplifier 12 is output to the antenna (not illustrated) and the feedback system 13.

As described above, the feedback system 13 corresponds to the frequency converter 172, the quadrature detector 162, and the A/D converter 142 in FIG. 4. The feedback system 13 outputs the transmission signal whose power is amplified by the power amplifier 12 to a polar coordinate converter 19 as the feedback signal y(t).

The LUT 14 stores distortion correction coefficients for correcting distortions, which occur in the power amplifier 12, in address positions each corresponding to each discrete power of the transmission signal x(t). The LUT 14 may store the distortion correction coefficients in two-dimensional address positions each corresponding to each discrete power of the transmission signal x(t). The LUT 14 stores an x-axis direction address uniquely corresponding to the power pi of the transmission signal x(t) and a y-axis direction address uniquely corresponding to a difference ΔP between the power pi of the transmission signal x(t) and a power pi of a transmission signal x(t−1). The LUT 14 may store the distortion correction coefficients in address positions each determined by a combination of the x-axis direction address and the Y-axis direction address. The LUT 14 may store the distortion correction coefficients in address positions each determined by a combination of the x-axis direction address and the Y-axis direction address, which are described above, and a Z-axis address uniquely corresponding to other information.

The address generation circuit 15 calculates the power pi of the transmission signal x(t) and generates an address uniquely corresponding to the power pi, which is the result of the arithmetic operation. When the LUT 14 stores the distortion correction coefficients in the two-dimensional address positions as in the above-described example, the address generation circuit 15 calculates the power pi of the transmission signal x(t) and generates an X-axis direction address uniquely corresponding to the power pi, which is the result of the arithmetic operation. The address generation circuit 15 generates the Y-axis direction address uniquely corresponding to the difference ΔP between the power pi of the transmission signal x(t) and the previous power pi of a transmission signal x(t−1).

The delay unit 16 delays the address that is generated by the address generation circuit 15 and then outputs the address to the LUT 14. For example, the delay unit 16 delays the address, which is input from the address generation circuit 15, for a period of time from when the transmission signal x(t) is input to the address generation circuit 15 until the feedback signal y(t) is input to a subtractor 20, and then the delay unit 16 outputs the address to the LUT 14.

The address that is input from the address generation circuit 15 to the LUT 14 is a read address of the distortion correction coefficient used for the multiplier 11. Specifically, the LUT 14 outputs the distortion correction coefficient, which corresponds to the address input from the address generation circuit 15, to an orthogonal coordinate converter 25. The multiplier 11 performs the distortion correction process by multiplying the transmission signal x(t) by the distortion correction coefficient, that is an orthogonal coordinate system signal converted from a polar coordinate system signal by the orthogonal coordinate converter 25.

The address that is input from the delay unit 16 to the LUT 14 is a write address of the distortion correction coefficient written by an amplitude coefficient clipping unit 24, which will be described below. The write address is an address similar to the above-described read address. The delay unit 16 delays the time for inputting the address to the LUT 14 because the subtractor 20 and a multiplier 21, which will be described below, require time to calculate a distortion correction coefficient that serves as an update value.

The delay unit 17 adds, to the transmission signal x(t), the delay time from when the transmission signal x(t) is input until the feedback signal y(t) is input to the subtractor 20. For example, the delay unit 17 adds, to the transmission signal x(t), a delay time D=D1+D2 that is a result of addition of a delay time D1 in the power amplifier 12 and a delay time D2 in the feedback system 13.

As illustrated in FIG. 6, the radio apparatus 100 includes a polar coordinate converter 18, the polar coordinate converter 19, the subtractor 20, the multiplier 21, a delay unit 22, an adder 23, and the amplitude coefficient clipping unit 24. The polar coordinate converter 18, the polar coordinate converter 19, the subtractor 20, the multiplier 21, and the adder 23 correspond to, for example, the distortion correction coefficient arithmetic operator 133 in FIG. 5. The amplitude coefficient clipping unit 24 corresponds to, for example, the distortion correction coefficient update unit 134 in FIG. 5.

The polar coordinate converter 18 converts the transmission signal x(t) of the orthogonal coordinate system, which is input from the delay unit 17, to a polar coordinate system signal. The polar coordinate converter 18 outputs the transmission signal that is the converted polar coordinate system signal to the subtractor 20.

The polar coordinate converter 19 converts the feedback signal y(t) of the orthogonal coordinate system, which is input from the feedback system 13, to a polar coordinate system signal. The polar coordinate converter 19 outputs the feedback signal that is the converted polar coordinate system signal to the subtractor 20.

The subtractor 20 calculates a difference e(t) between the transmission signal that is input from the polar coordinate converter 18 and the feedback signal that is input from the polar coordinate converter 19. The subtractor 20 outputs the difference e(t) between the transmission signal and the feedback signal to the multiplier 21.

The multiplier 21 multiplies the difference e(t) between the transmission signal and the feedback signal, which is input from the subtractor 20, by a step-size parameter μ. The step-size parameter μ is a value for gradually updating the distortion correction coefficient and represents an updating rate of the distortion correction coefficient.

The delay unit 22 adds a delay time D to the distortion correction coefficient h(i) that is output from the LUT 14. The delay time D is similar to the delay time D that is added by the delay unit 17 to the transmission signal x(t).

The adder 23 adds a value μ·e(t), which is output from the multiplier 21, and the distortion correction coefficient h(i), which is output from the delay unit 22. Accordingly, the adder 23 obtains a distortion correction coefficient that serves as an update value of the distortion correction coefficient h(i) stored in the LUT 14.

The amplitude coefficient clipping unit 24 determines whether the power pi of the transmission signal x(t), which is input from the polar coordinate converter 18, is equal to or larger than the power threshold. For example, when the transmission signal x(t) that is input from the polar coordinate converter 18 is "r∠", the amplitude coefficient clipping unit 24 determines whether "r" is equal to or larger than the power threshold.

When the power pi of the transmission signal x(t) is equal to or larger than the power threshold, the amplitude coefficient clipping unit 24 compares the distortion correction coefficient, which is input from the adder 23, with the first threshold. When the distortion correction coefficient is larger than the first threshold, the amplitude coefficient clipping unit 24 stores the first threshold in the position that is represented by the write address, which is input from the delay unit 16 to the LUT 14. In contrast, when the distortion correction coefficient is equal to or smaller than the first threshold, the amplitude coefficient clipping unit 24 stores the distortion correction coefficient, which is input from the adder 23, in the position represented by the write address. In other words, when the distortion correction coefficient, which is input from the adder 23, is larger than the first threshold, the amplitude coefficient clipping unit 24 limits the distortion correction coefficient to the first threshold by clipping.

When the power of the transmission signal x(t) is smaller than the power threshold, the amplitude coefficient clipping unit 24 compares the distortion correction coefficient, which is input from the adder 23, with the second threshold. When the distortion correction coefficient is larger than the second threshold, the amplitude coefficient clipping unit 24 stores the second threshold in the position that is represented by the write address, which is input from the delay unit 16 to the LUT 14. In contrast, when the distortion correction coefficient is equal to or smaller than the second threshold, the amplitude coefficient clipping unit 24 stores the distortion correction coefficient, which is input from the adder 23, in the position represented by the write address, which is input from the delay unit 16 to the LUT 14. In other words, when the distortion correction coefficient, which is input from the adder 23, is larger than the second threshold, the amplitude coefficient clipping unit 24 limits the distortion correction coefficient to the second threshold by clipping.

Figure 7:
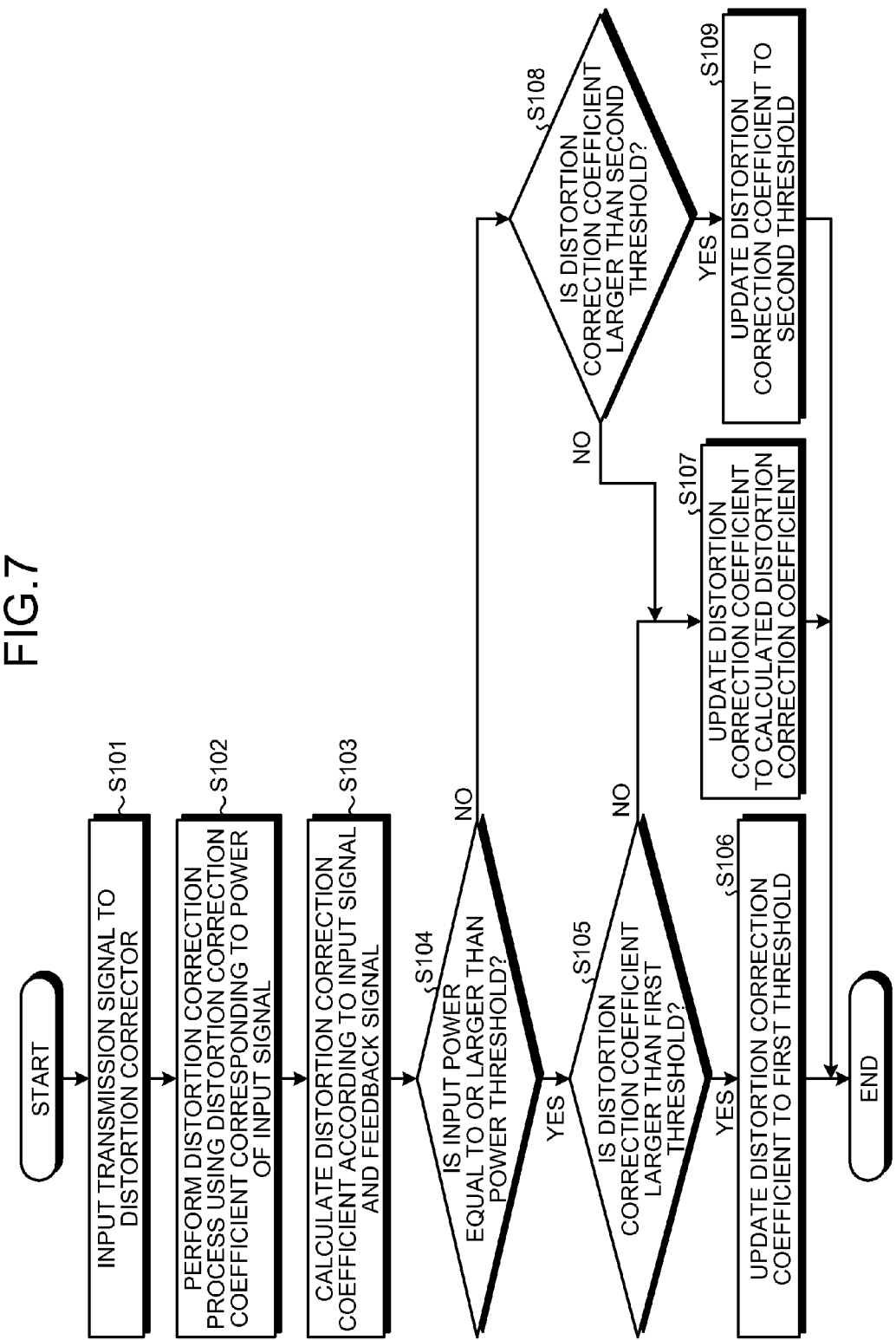
FIG. 7 is a flowchart of a procedure of a distortion correction coefficient update process performed by the radio apparatus according to the second embodiment.

Procedure of Distortion Correction Coefficient Update Process Performed by Radio Apparatus According to Second Embodiment A procedure of the distortion correction coefficient update process, which is performed by the radio apparatus 100 according to the second embodiment, will be described using FIG. 7. FIG. 7 is a flowchart of the procedure of the distortion correction coefficient update process performed by the radio apparatus 100 according to the second embodiment. The distortion correction coefficient update process performed by the units in FIGS. 4 and 5 will be described below.

As illustrated in FIG. 7, the S/P converter 120 of the radio apparatus 100 inputs a transmission signal to the predistortion unit 132 and the distortion correction coefficient arithmetic operator 133 of the distortion corrector 130 (step S101).

The predistortion unit 132 of the distortion corrector 130 acquires the distortion correction coefficient corresponding to the power of the input signal, which is input from the S/P converter 120, from the distortion correction coefficient storage unit 131 and performs the distortion correction process on the input signal using the acquired distortion correction coefficient (step S102). The transmission signal on which the distortion correction process is performed by the distortion corrector 130 is input to the power amplifier 180. The transmission signal whose power is amplified by the power amplifier 180 is emitted to the atmosphere via the antenna 191 and fed back to the distortion correction coefficient arithmetic operator 133 of the distortion corrector 130.

The distortion correction coefficient arithmetic operator 133 calculates a distortion correction coefficient according to the input signal, which is input from the S/P converter 120, and the feedback signal (step S103). For example, as in the example in FIG. 5, the distortion correction coefficient arithmetic operator 133 multiplies the difference signal e(t) between the input signal and the feedback signal by the step-size parameter μ. The distortion correction coefficient arithmetic operator 133 calculates an update value of the distortion correction coefficient, which is stored in the distortion correction coefficient storage unit 131, by adding the multiplication result μ·e(t) and the distortion correction coefficient.

When the power of the signal, which is input from the S/P converter 120, is equal to or larger than the power threshold (YES at step S104), the distortion correction coefficient update unit 134 compares the distortion correction coefficient, which is obtained by the distortion correction coefficient arithmetic operator 133, with the first threshold (step S105).

When the distortion correction coefficient is larger than the first threshold (YES at step S105), the distortion correction coefficient update unit 134 updates the distortion correction coefficient corresponding to the input power, which is stored in the distortion correction coefficient storage unit 131, to the first threshold (step S106). In contrast, when the distortion correction coefficient is equal to or smaller than the first threshold (NO at step S105), the distortion correction coefficient update unit 134 updates the distortion correction coefficient, which is stored in the distortion correction coefficient storage unit 131, to the distortion correction coefficient, which is obtained by the distortion correction coefficient arithmetic operator 133 (step S107).

When the input power is smaller than the power threshold (NO at step S104), the distortion correction coefficient update unit 134 compares the distortion correction coefficient, which is obtained by the distortion correction coefficient arithmetic operator 133, with the second threshold (step S108).

When the distortion correction coefficient is larger than the second threshold (YES at step S108), the distortion correction coefficient update unit 134 updates the distortion correction coefficient corresponding to the input power, which is stored in the distortion correction coefficient storage unit 131, to the second threshold (step S109). In contrast, when the distortion correction coefficient is equal to or smaller than the second threshold (NO at step S108), the distortion correction coefficient update unit 134 updates the distortion correction coefficient, which is stored in the distortion correction coefficient storage unit 131, to the distortion correction coefficient, which is obtained by the distortion correction coefficient arithmetic operator 133 (step S107).

Effects of Second Embodiment

As described above, the radio apparatus 100 according to the second embodiment performs the distortion correction coefficient update process using a different threshold depending on the power that is input to the power amplifier 180. Accordingly, even when the upper-limit value of the distortion correction coefficient differs depending on the input power, the radio apparatus according to the second embodiment can update the distortion correction coefficient in a range in which the predetermined quality of the transmission signal can be ensured. This broadens the power range of the transmission signal ensuring the communication quality.

In general, the frequency that the power that is input to the power amplifier 180 reaches the vicinity of the saturation value of the power amplifier 180 is low. In other words, the frequency that the distortion correction coefficient in the saturation proximity power range is updates is also low. For this reason, the reliability of the distortion correction coefficient corresponding to the saturation proximity power range is low. However, the radio apparatus 100 according to the second embodiment limits the distortion correction coefficient in the saturation proximity power range to the first threshold by clipping. Thus, even when the radio apparatus 100 performs the distortion correction process using the distortion correction coefficient in the saturation proximity power range regarding which the update frequency is low, the radio apparatus 100 can ensure the predetermined quality of the transmission signal. For example, in the example illustrated in FIG. 3, the radio apparatus 100 does not update the distortion correction coefficient in the saturation proximity power range to a value larger than "2.0". In other words, the radio apparatus 100 can ensure the predetermined quality of the transmission signal if the power that is input to the power amplifier 180 is smaller than "P83".

Figure 8:
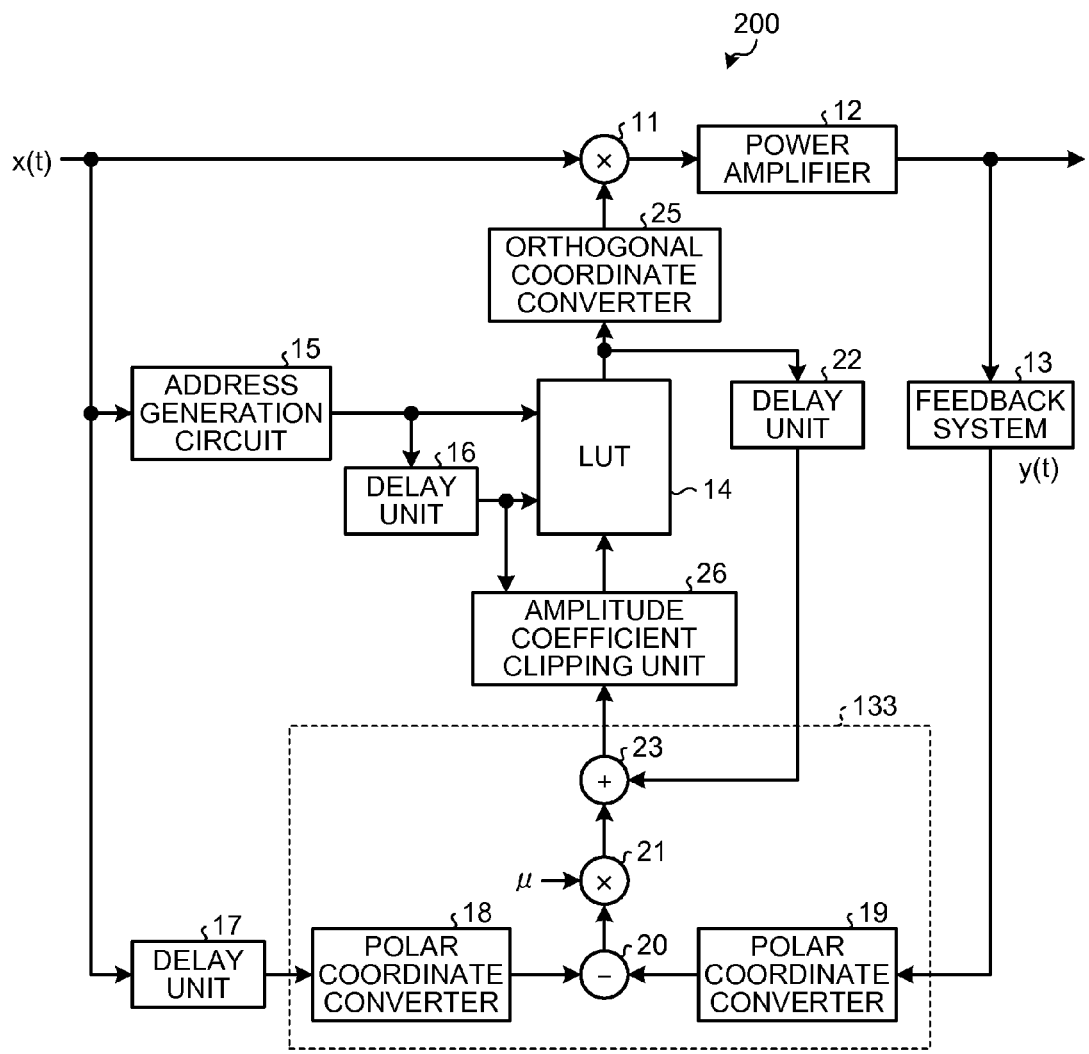
FIG. 8 is a block diagram of an example of the detailed configuration the radio apparatus according to the second embodiment.
Figure 9:
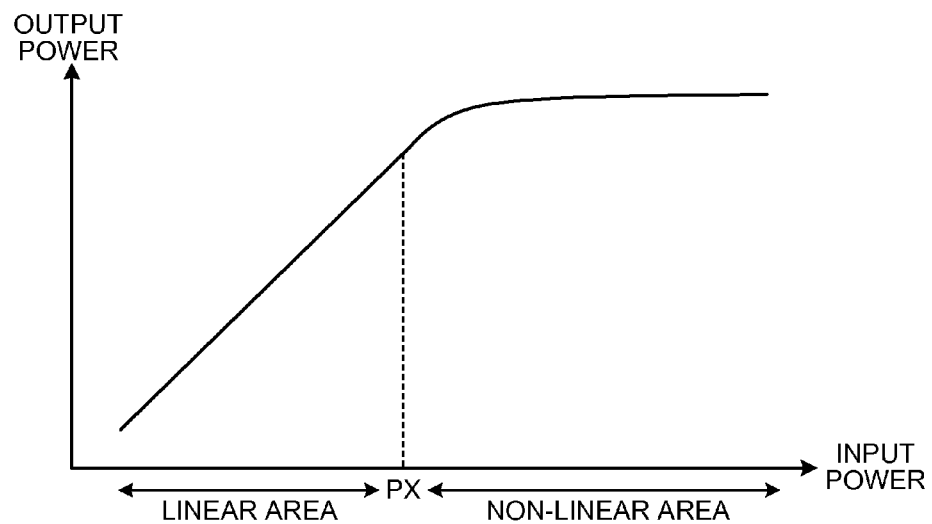
FIG. 9 is a graph of an example of I/O characteristics of a power amplifier.
Figure 10:
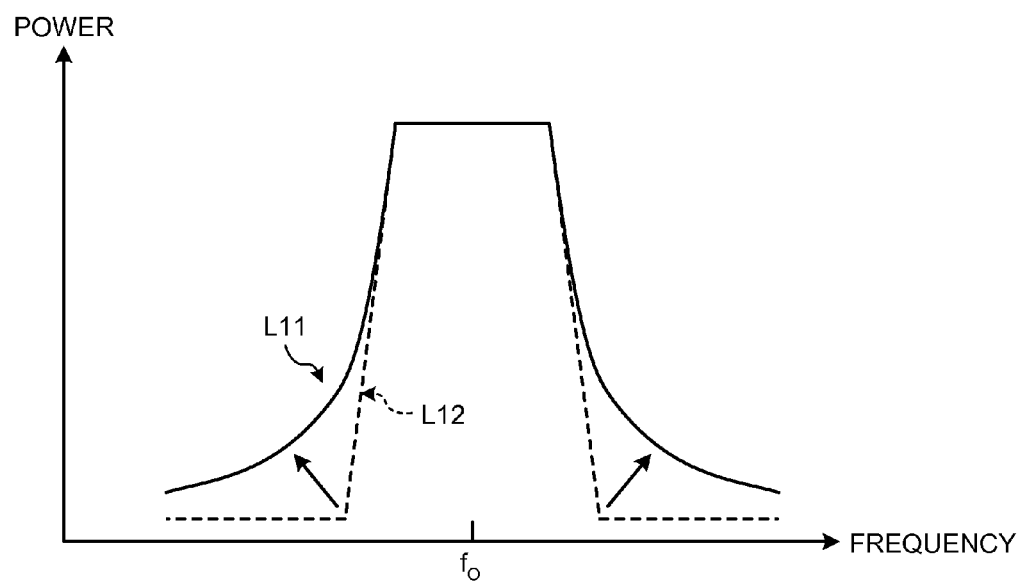
FIG. 10 is a graph of an example of frequency spectrums.
Figure 11:
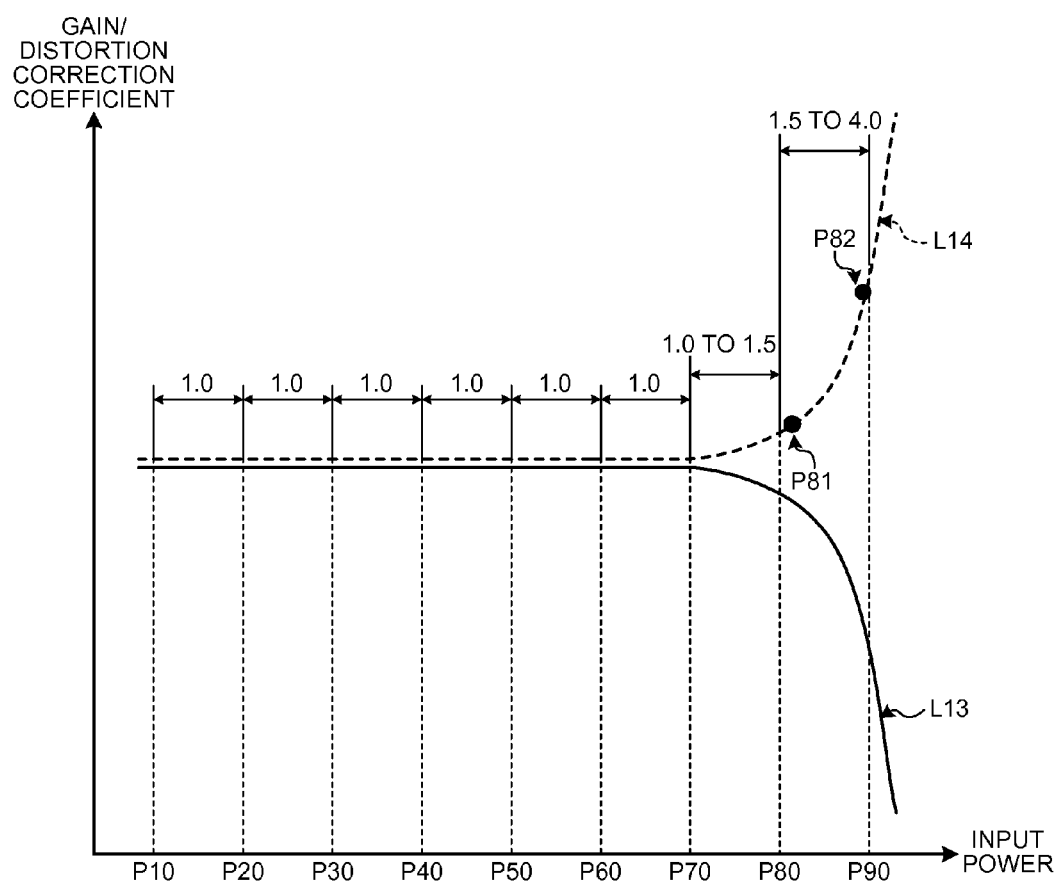
FIG. 11 is a graph of the relation between the gain of a power amplifier and an expected value of a distortion correction coefficient.

In the second embodiment, the detailed configuration example of the radio apparatus 100 is illustrated in FIG. 6. However, the detailed configuration example of the radio apparatus 100 is not limited to the example illustrated in FIG. 6. FIG. 8 illustrates another example of the detailed configuration of the radio apparatus 100. Units having the same functions as those of the above-described units are denoted by the same reference numerals of the above-described units and the detailed description thereof will be omitted below.

Compared to the radio apparatus 100 in FIG. 6, a radio apparatus 200 in FIG. 8 includes an amplitude coefficient clipping unit 26 instead of the amplitude coefficient clipping unit 24. The amplitude coefficient clipping unit 26 determines whether the power of the transmission signal x(t) is equal to or larger than the power threshold using an address that is input from the delay unit 16. Specifically, the address that is input from the delay unit 16 is information that can specify the power of the transmission signal x(t). Accordingly, the amplitude coefficient clipping unit 26 determines whether the power of the transmission signal x(t) that is represented by the address, which is input from the delay unit 16, is equal to or larger than the power threshold. After the determination process, the amplitude coefficient clipping unit 26 performs the process from steps S105 to S109 in FIG. 7 as the amplitude coefficient clipping unit 24 does.

The process procedure, control procedure, specific names, and information including various types of data and parameters (for example, FIGS. 2, 3, and 7) can be arbitrarily changed unless otherwise noted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio apparatus comprising:
   a power amplifier that amplifies a power of an input signal;
   a storage unit that stores a distortion correction coefficient for correcting distortion occurring in the power amplifier, the distortion correction coefficient being stored in association with a predetermined power range of the input signal;
   a distortion corrector that acquires a distortion correction coefficient corresponding to the power of the input signal from the storage unit and performs a distortion correction process on the input signal using the acquired distortion correction coefficient;
   an arithmetic operator that calculates a distortion correction coefficient according to the input signal and an output signal output from the power amplifier;
   a comparator that compares a first threshold with the distortion correction coefficient obtained by the arithmetic operator, the first threshold being the maximum distortion correction coefficient that ensures predetermined quality with respect to an input signal having the minimum power in a power range regarding which the maximum difference between expected values of a distortion correction coefficient corresponding to each signal within the power range is equal to or larger than a predetermined value; and
   an update unit that updates the distortion correction coefficient stored in the storage unit and corresponding to the input signal to the first threshold, when the distortion correction coefficient obtained by the arithmetic operator is larger than the first threshold as a result of the comparing by the comparator.

2. The radio apparatus according to claim 1, wherein
   the comparator compares the distortion correction coefficient obtained by the arithmetic operator with a second threshold larger than the first threshold, when the power of the input signal is smaller than a predetermined power threshold, and
   when the distortion correction coefficient obtained by the arithmetic operator is larger than the second threshold as a result of the comparing by the comparator, the update unit updates the distortion correction coefficient stored in the storage unit and corresponding to the input signal to the second threshold.

3. A distortion correction apparatus comprising:
   a storage unit that stores distortion correction coefficients for correcting distortion occurring in a power amplifier, the distortion correction coefficients being stored respectively for predetermined power ranges of an input signal of the power amplifier;
   a distortion corrector that acquires a distortion correction coefficient corresponding to a power of the input signal from the storage unit and performs a distortion correction process on the input signal using the acquired distortion correction coefficient;

an arithmetic operator that calculates a distortion correction coefficient according to the input signal and an output signal output from the power amplifier;

a comparator that compares a first threshold with the distortion correction coefficient obtained by the arithmetic operator, the first threshold being the maximum distortion correction coefficient that ensures predetermined quality with respect to an input signal having the minimum power in a power range regarding which the maximum difference between expected values of a distortion correction coefficient corresponding to a signal within the power range is equal to or larger than a predetermined value; and an update unit that updates the distortion correction coefficient stored in the storage unit and corresponding to the input signal to the first threshold, when the distortion correction coefficient obtained by the arithmetic operator is larger than the first threshold as a result of the comparing by the comparator.

4. A distortion correction method for performing a distortion correction process on an input signal of a power amplifier, the distortion correction method comprising:

acquiring a distortion correction coefficient corresponding to a power of the input signal from a storage unit storing distortion correction coefficients for correcting distortion occurring in the power amplifier, the distortion correction coefficients being stored respectively for predetermined power ranges of the input signal;

performing the distortion correction process on the input signal using the acquired distortion correction coefficient;

calculating a distortion correction coefficient according to the input signal and an output signal output from the power amplifier;

comparing a first threshold with the distortion correction coefficient calculated at the calculating, the first threshold being the maximum distortion correction coefficient that ensures predetermined quality with respect to an input signal having the minimum power in a power range regarding which the maximum difference between expected values of a distortion correction coefficient corresponding to a signal within the power range is equal to or larger than a predetermined value; and updating the distortion correction coefficient stored in the storage unit and corresponding to the input signal to the first threshold, when the distortion correction coefficient calculated at the calculating is larger than the first threshold as a result of the comparing.

* * * * *